United States Patent
Ishii et al.

(10) Patent No.: US 6,873,042 B2
(45) Date of Patent: Mar. 29, 2005

(54) PLURALITY OF POWER ELEMENTS WITH GATE INTERCONNECTIONS HAVING EQUAL LENGTHS

(75) Inventors: Kazufumi Ishii, Tokyo (JP); Shinichi Iura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/276,333

(22) PCT Filed: Apr. 2, 2001

(86) PCT No.: PCT/JP01/02875

§ 371 (c)(1),
(2), (4) Date: Nov. 26, 2002

(87) PCT Pub. No.: WO02/082541

PCT Pub. Date: Oct. 17, 2002

(65) Prior Publication Data

US 2003/0173579 A1 Sep. 18, 2003

(51) Int. Cl.⁷ .......................... H01L 25/04; H01L 25/07; H01L 25/18; H01L 25/74
(52) U.S. Cl. .................... 257/702; 257/724; 257/729
(58) Field of Search ................ 257/702, 723, 257/724, 729, 730, 736, 791

(56) References Cited

U.S. PATENT DOCUMENTS 5,929,519 A * 7/1999 Mori et al. ............... 257/724
5,942,797 A 8/1999 Terasawa ................ 257/723
5,966,291 A 10/1999 Baumel et al. ............ 361/707
6,060,772 A 5/2000 Sugawara et al. ......... 257/723

FOREIGN PATENT DOCUMENTS

EP 772235 5/1997

* cited by examiner

Primary Examiner—Minhloan Tran
Assistant Examiner—Thomas L Dickey
(74) Attorney, Agent, or Firm—Oblon, Spivak, McClelland, Maier & Neustadt, P.C.

(57) ABSTRACT

Power semiconductor devices, and particularly a power semiconductor device which contains a plurality of power semiconductor elements. The power semiconductor device capable of reducing differences in impedance caused by differences in length among wire interconnections, facilitating the electric connection between main circuit terminals and the outside, and lightening restrictions on the number and layout of the power semiconductor elements installed. In the power semiconductor device, a rectangular-loop-shaped interconnection board is disposed above a bottom substrate to cover an area above edges of the bottom substrate, with an opening above the center part of the bottom substrate. A main collector electrode terminal and a main emitter electrode terminal pass through the opening to protrude from an opening of a resin case so that they can be electrically connected to the outside. Control emitter pads and gate pads are electrically connected to the control emitter electrodes and the gate terminals through wire interconnections of equal length.

11 Claims, 13 Drawing Sheets

PLURALITY OF POWER ELEMENTS WITH GATE INTERCONNECTIONS HAVING EQUAL LENGTHS

TECHNICAL FIELD

The present invention relates to power semiconductor devices, and particularly to a power semiconductor device which contains a plurality of power semiconductor elements.

BACKGROUND ART

FIGS. 17 and 18 are a plan view and a cross-sectional view showing the structure of a power semiconductor device 70 as an example of a conventional power semiconductor device. FIG. 18 is the cross section taken along the line X—X in FIG. 17.

In FIGS. 17 and 18, a bottom substrate 12 has a rectangular shape in plan view and is made of a material having good thermal conductivity, e.g. metal, and two insulating substrates 3 are disposed in parallel at an interval on a main surface of the bottom substrate 12 and three sets of devices, each including one IGBT (Insulated Gate Bipolar Transistor) device 1 and one diode device 2, are disposed on each insulating substrate 3.

Also on the main surface of the bottom substrate 12, a main collector electrode terminal 4 and a main emitter electrode terminal 5 are disposed in the region between the two insulating substrates 3, with a C-shaped control emitter relay terminal plate 39 surrounding the main collector electrode 4 and the main emitter electrode terminal 5. The main collector electrode terminal 4 and the main emitter electrode terminal 5 are provided on the bottom substrate 12 with a main collector substrate 41 and a main emitter substrate 51 interposed therebetween.

Further, gate relay terminal plates 36 are disposed along the insulating substrates 3 at both ends of the bottom substrate 12 in the direction along the row of the insulating substrates 3. The gate electrode of each IGBT device 1 is electrically connected to the nearby gate relay terminal plate 36 through a wire interconnection WR, and the anode of each diode device 2 is electrically connected to the nearby control emitter relay terminal 39 through a wire interconnection WR. The control emitter electrode of each IGBT device 1 is electrically connected to the anode of the diode device 2 in the same set through a wire interconnection WR.

Now, FIG. 19 shows the connection of the IGBT devices 1 and diode devices 2. As shown in FIG. 19, six IGBT devices 1 are connected in parallel and the diode devices 2 are connected with them in parallel in a one-to-one manner in such a direction that the forward current flows back to the IGBT device 1, so that they can function as free-wheel diodes. The IGBT devices 1 have their respective gate electrodes connected to a gate derive terminal 66 in common and their control emitter electrodes (equivalent to the emitter electrodes) connected to a control emitter derive terminal 69 in common and also to the main emitter electrode terminal 5.

The control emitter derive terminal 69 is used to drive the IGBT devices 1; a gate-emitter voltage (e.g. about 15 V) is applied between the control emitter derive terminal 69 and the gate derive terminal 66 to drive the IGBT devices 1.

In FIGS. 17 and 18, the two gate relay terminal plates 36 are electrically connected in common to the gate derive terminal 66 through an interconnection bar 46 extending parallel to the main surface of the bottom substrate 12, and the control emitter relay terminal plate 39 is connected to the control emitter derive terminal 69 through an interconnection bar 49 extending parallel to the main surface of the bottom substrate 12.

The gate derive terminal 66 vertically extends from the gate relay terminal plate 36 on the left side in FIG. 17 and the interconnection bar 46 is connected to the gate derive terminal 66.

The control emitter derive terminal 69 stands parallel to the gate derive terminal 66 and vertically extends above the gate relay terminal plate 36 on the left side in FIG. 17; while the gate derive terminal 66 is electrically connected to the gate relay terminal plate 36, the control emitter derive terminal 69 is not in contact with the gate relay terminal plate 36.

A rectangular box-like resin case 11 surrounds the bottom substrate 12 and a resin material is sealed in the space defined by the bottom substrate 12 and the resin case 11.

The gate derive terminal 66, the control emitter derive terminal 69, the main collector electrode terminal 4, and the main emitter electrode terminal 5 vertically extend to protrude through an opening in the resin case 11 so that they can be electrically connected to the outside.

Note that, for convenience, FIGS. 17 and 18 do not show means electrically connecting the emitter electrodes and the main emitter electrode terminal 5 and means electrically connecting the collector electrodes of the IGBT devices 1 and the main collector electrode terminal 4, since they are not closely related to this invention.

FIGS. 20 and 21 are a plan view and a cross-sectional view showing the structure of a power semiconductor device 80 as an example of a conventional power semiconductor device.

The structure of the power semiconductor device 80 is basically the same as that of the power semiconductor device 70 described referring to FIGS. 17 and 18 and the same components are shown with the same reference characters and are not described again here. FIG. 21 is the cross section taken along the line Y—Y in FIG. 20.

In FIGS. 20 and 21, a rectangular control board CB is disposed to almost entirely cover the area above the bottom substrate 12. The gate relay terminal plates 36 and the control emitter relay terminal plate 39 are electrically connected to the control board CB through gate relay terminals 88 and a control emitter relay terminal 77 that vertically extend to the control board CB.

The control board CB has control circuitry and elements for controlling operations of the IGBT devices 1 and the diode devices 2; the control circuitry is thus contained in the power semiconductor device 80 to allow it to work as an IPM (Intelligent Power Module).

The main collector electrode terminal 4 and the main emitter electrode terminal 5 are connected to a main collector derive terminal 43 and a main emitter derive terminal 53 respectively through interconnection bars 42 and 52 that extend parallel to the main surface of the bottom substrate 12.

The main collector derive terminal 43 and the main emitter derive terminal 53 vertically extend above the gate relay terminal plate 36 on the left side in FIG. 20 to protrude through the opening in the resin case 11 so that they can be electrically connected to the outside. A plurality of derive terminals OT are disposed on the top main surface of the control board CB, which protrude through the opening of the resin case 11 so that they can be electrically connected to the outside. These derive terminals OT serve as gate derive terminal and control emitter derive terminal.

FIGS. 22 and 23 are a plan view and a cross-sectional view showing the structure of a power semiconductor device 90 as an example of a conventional power semiconductor device. FIG. 23 is the cross section taken along the line C—C in FIG. 22.

In FIGS. 22 and 23, one insulating substrate 3 is disposed approximately in the center of the bottom substrate 12 that has a rectangular shape in plan view and three sets of devices, each including one IGBT device 1 and one diode device 2, are provided on the insulating substrate 3.

A control board CB is disposed adjacent to the row of the IGBT devices 1 on the insulating substrate 3 and the gate electrodes of the IGBT devices 1 are electrically connected to the control board CB through wire interconnections WR.

A control emitter relay terminal plate 39A having an L shape in plan view is disposed with its one side extending adjacent to the row of the diode devices 2 on the insulating substrate 3 and the respective anodes of the diode devices 2 are electrically connected to the control emitter relay terminal plate 39A through wire interconnections WR. The control emitter electrodes of the IGBT devices 1 are electrically connected to the anodes of the diode devices 2 in the respective sets through wire interconnections WR.

Another side of the emitter relay terminal plate 39A extends parallel to the insulating substrate 3 and the control board CB, and is electrically connected to the control board CB through a wire interconnection WR. An derive terminal OT vertically extends from the main surface of the control board CB; given control signals are externally applied to the control board CB through the derive terminal OT and given signals are externally outputted therethrough from the control board CB.

The main collector electrode terminal 4 and the main emitter electrode terminal 5 are located in the edge portion opposite to the control board CB. The main collector electrode 4 terminal and the main emitter electrode terminal 5 vertically extend to protrude through the opening of the resin case 11 so that they can be electrically connected to the outside.

As described above, in the conventional power semiconductor devices 70 to 90, the gate relay terminal plate 36 is disposed next to the IGBT devices 1 so that the wire interconnections WR electrically connecting the gate electrodes of the IGBT devices 1 and the gate relay terminal plate 36 are equal in length, and the emitter relay terminal plate 39 or 39A is disposed next to the diode devices 2 so that the wire interconnections WR electrically connecting the anodes of the diode devices 2 and the emitter relay terminal plate 39 or 39A are equal in length. This reduces differences in impedance caused by differences in length among the wire interconnections WR, thus preventing imbalance in the main current flowing to the IGBT devices 1; however, these devices have the following problems.

That is to say, the power semiconductor device 70 requires the interconnection bar 46 to electrically connect the gate relay terminal plates 36 located at both ends of the bottom substrate 12, and also requires the interconnection bar 49 to connect the emitter relay terminal plate 39 to the control emitter derive terminal 69. The provision of the interconnection bars 46 and 49 restricts the layout of the IGBT devices 1 and the diode devices 2, and also a process for providing the interconnection bars 46 and 49 is required and the number of parts is increased, leading to an increase in manufacturing cost.

In the power semiconductor device 80 working as an IPM, the control board CB entirely covers the area above the bottom substrate 12, so that the main circuit terminals, i.e. the main collector electrode terminal 4 and the main emitter electrode terminal 5, have to be connected respectively through the interconnection bars 42 and 52 extending parallel to the main surface of the bottom substrate 12, to the main collector derive terminal 43 and the main emitter derive terminal 53 located at an end of the bottom substrate 12; it is thus difficult to make electric connections to the outside, and the long main circuit interconnections increase inductance and may affect the performance of the semiconductor device by, e.g. increasing the surge voltage.

In the power semiconductor device 90, also working as an IPM, the control board CB is disposed on the bottom substrate 12, so that the main collector electrode terminal 4 and the main emitter electrode terminal 5 can be easily connected electrically to the outside; however, the provision of the control board CB limits the area for installation of the IGBT devices 1 and the diode devices 2, which limits the number and layout of the power semiconductor elements installed.

DISCLOSURE OF THE INVENTION

The present invention has been made to solve the problems shown above, and an object of the invention is to provide a power semiconductor device which is capable of reducing differences in impedance caused by differences in length among wire interconnections, facilitating the electric connection between the main circuit terminals and the outside, and lightening restrictions on the number and layout of the power semiconductor elements installed.

According to a first aspect of the invention, a power semiconductor device comprises: a bottom substrate; at least one insulating substrate having a given circuit pattern and provided on said bottom substrate; a plurality of power switching elements (1) provided on said at least one insulating substrate; and a board at least having a gate interconnection pattern which is electrically connected in common to the respective gate electrodes of said plurality of power switching elements; wherein said board is disposed above part of said bottom substrate, and said gate interconnection pattern is connected to said respective gate electrodes of said plurality of power switching elements through connecting means having an equal electric connection length.

According to the first aspect of the power semiconductor device of the invention, the board is disposed partially above the bottom substrate so that, for example, the main electrode plates can easily be electrically connected to the outside, which prevents the problem that a long main circuit interconnection increases the inductance and exerts influence on the performance by, e.g. increasing the surge voltage. Further, the gate interconnection pattern is connected through the connecting means having an equal electric connection length to the respective gate electrodes of the plurality of power switching elements, which reduces differences in impedance caused by differences among the lengths between the respective gate electrodes of the plurality of power switching elements and the gate interconnection pattern. Also, the board, having the gate interconnection pattern electrically connected in common to the gate electrodes of the plurality of power switching elements, is disposed above the bottom substrate, so that the bottom substrate can be effectively used to install the plurality of power switching elements, thus providing a power semiconductor device suffering reduced restrictions on the number and layout of the power switching elements, and reducing gate voltage variations and oscillations caused by a current flowing in the main circuit.

According to a second aspect of the invention, the power semiconductor device further comprises: a resin case disposed to surround said bottom substrate; and at least one pair of main electrode plates through which a main current of said plurality of power switching elements flows, wherein said connecting means comprises: at least one relay substrate provided on said bottom substrate and functioning as a relay point of the electric connection between said gate electrodes and said gate interconnection pattern; gate relay means electrically connecting said gate interconnection pattern and said at least one relay substrate; and wire interconnections connecting said at least one relay substrate and said gate electrodes of said plurality of power switching elements through equal lengths, and wherein said board is disposed to cover an area above said at least one relay substrate without hindering said at least one pair of main electrode plates from extending out of said resin case through a shortest distance.

According to the second aspect of the power semiconductor device of the invention, the board is disposed to cover an area above the at least one relay substrate and not to hinder the at least one pair of main electrode plates from extending out of the resin case through the shortest route, so that the main electrode plates can be electrically connected to the outside through the shortest distance, thereby preventing the problem that a long main circuit interconnection increases the inductance and influences the performance by, e.g. increasing the surge voltage. Further, the at least one relay substrate and the gate electrodes of the plurality of power switching elements are connected through wire interconnections of equal length, which reduces differences in impedance due to differences in length among the wire interconnections.

According to a third aspect of the power semiconductor device of the invention, said board further comprises a control emitter interconnection pattern electrically connected in common to control emitter electrodes of said plurality of power switching elements, and said at least one relay substrate functions also as a relay point of the electric connection between said control emitter electrodes and said control emitter interconnection pattern, and wherein said connecting means further comprises: control emitter relay means electrically connecting said control emitter interconnection pattern and said at least one relay substrate; and wire interconnections connecting said at least one relay substrate and said control emitter electrodes of said plurality of power switching elements through equal lengths.

According to the third aspect of the power semiconductor device of the invention, the at least one relay substrate and the control emitter electrodes of the plurality of power switching elements are connected through wire interconnections of equal length, which further reduces the differences in impedance due to differences in length among the wire interconnections.

According to a fourth aspect of the power semiconductor device of the invention, said gate relay means includes pillar-like gate relay terminals disposed to vertically extend above said at least one relay substrate and directly connected to said gate interconnection pattern.

According to the fourth aspect of the power semiconductor device of the invention, the gate relay means includes pillar-like gate relay terminals which are directly connected to the gate interconnection pattern, and thus the gate relay means can be made to provide an equal length.

According to a fifth aspect of the power semiconductor device of the invention, said gate relay means includes wire interconnections connecting said at least one relay substrate and said gate interconnection pattern.

According to the fifth aspect of the power semiconductor device of the invention, the gate relay means includes wire interconnections, so that the at least one relay substrate and the gate interconnection pattern can be connected easily by wire bonding.

According to a sixth aspect of the power semiconductor device of the invention, said board is a control board in which a control circuit for driving and controlling said power switching elements can be provided.

According to the sixth aspect of the power semiconductor device of the invention, the board is a control board in which a control circuit for driving and controlling the power switching elements can be provided, and thus an IPM with built-in control circuit can be obtained easily.

According to a seventh aspect of the invention, the power semiconductor device further comprises at least one pair of main electrode plates through which a main current of said plurality of power switching elements flows, wherein said connecting means comprises: two relay substrates provided on said bottom substrate and functioning as relay points of the electric connection between said gate electrodes and said gate interconnection pattern; gate relay means electrically connecting said gate interconnection pattern and said two relay substrates; and wire interconnections connecting said two relay substrates and said gate electrodes of said plurality of power switching elements through equal lengths, and wherein said at least one insulating substrate includes two insulating substrates disposed on both sides of a region where said at least one pair of main electrode plates are disposed, said plurality of power switching elements are equally divided into two rows that are arranged respectively on said two insulating substrates, and said two relay substrates are located close to said two insulating substrates in a one-to-one correspondence and are disposed respectively along the rows of said power switching elements.

The seventh aspect of the power semiconductor device of the invention provides an effective structure for connecting the relay substrates and the gate electrodes of the power switching elements through wire interconnections of equal length, which promotes size reduction of the device.

According to an eighth aspect of the power semiconductor device of the invention, said gate relay means includes pillar-like gate relay terminals disposed to vertically extend respectively above said two relay substrates and directly connected to said gate interconnection pattern.

According to the eighth aspect of the power semiconductor device of the invention, the gate relay means includes pillar-like gate relay terminals directly connected to the gate interconnection pattern, and thus the gate relay means can be made to provide an equal length.

According to a ninth aspect of the power semiconductor device of the invention, said board has a rectangular loop shape in plan view which has, in its opening, a path through which said at least one pair of main electrode plates extend outward.

According to the ninth aspect of the power semiconductor device of the invention, the connection to the relay substrates can be made easily when, e.g. two relay substrates are disposed opposite each other at two ends of the bottom substrate.

According to a tenth aspect of the power semiconductor device of the invention, said gate interconnection pattern has a non-looped, rectangular-loop-like shape in plan view which is formed by partially cutting off a rectangular loop similar to the shape of said board.

According to the tenth aspect of the power semiconductor device of the invention, the gate interconnection pattern is shaped like a non-looped rectangular ring, and therefore the main circuit current does not cause a circular flow of induced current and gate characteristic variations can be prevented.

According to an eleventh aspect of the power semiconductor device of the invention, said board is approximately C-shaped in plan view and which has, in its opening, a path through which said at least one pair of main electrode plates extend outward.

According to the eleventh aspect of the power semiconductor device of the invention, the connection to the relay substrates can be made easily when, e.g. two relay substrates are disposed opposite each other at two ends of the bottom substrate, and the gate interconnection pattern is not formed as a ring-like interconnection pattern surrounding the main electrode plates, so that the main circuit current will not cause a circular flow of induced current which may vary the gate characteristic.

The objects, features, aspects, and advantages of the present invention will become more apparent from the following detailed description and the accompanying drawings.

BEST MODE FOR CARRYING OUT THE INVENTION

A. First Preferred Embodiment

A-1. Device Structure.

Figure 1:
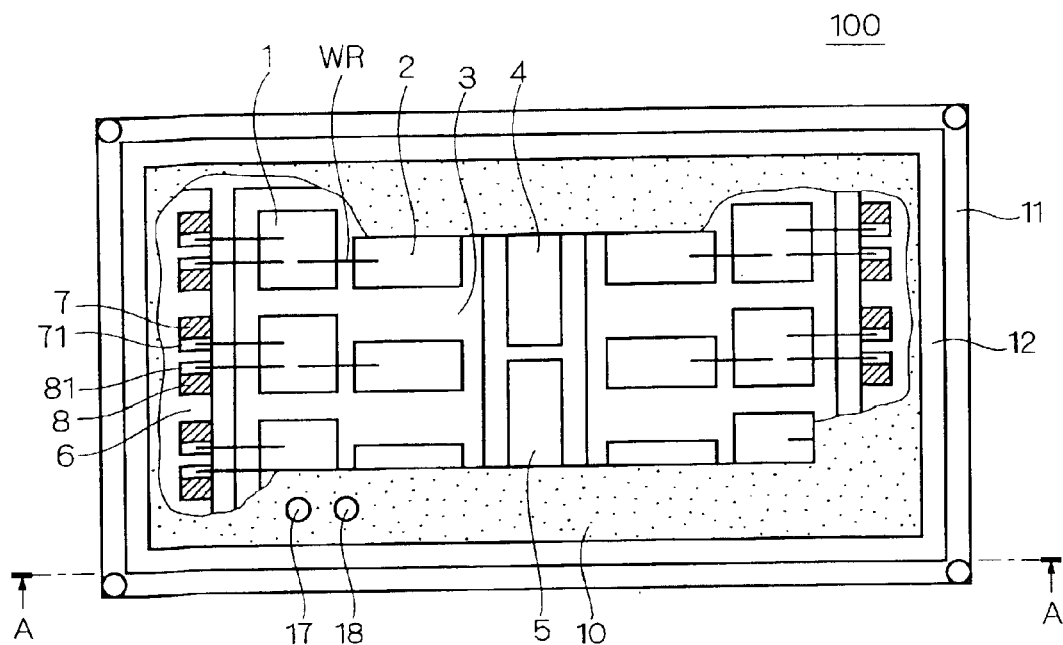
FIG. 1 is a plan view showing the structure of a power semiconductor device according to a first preferred embodiment of the invention.
Figure 2:
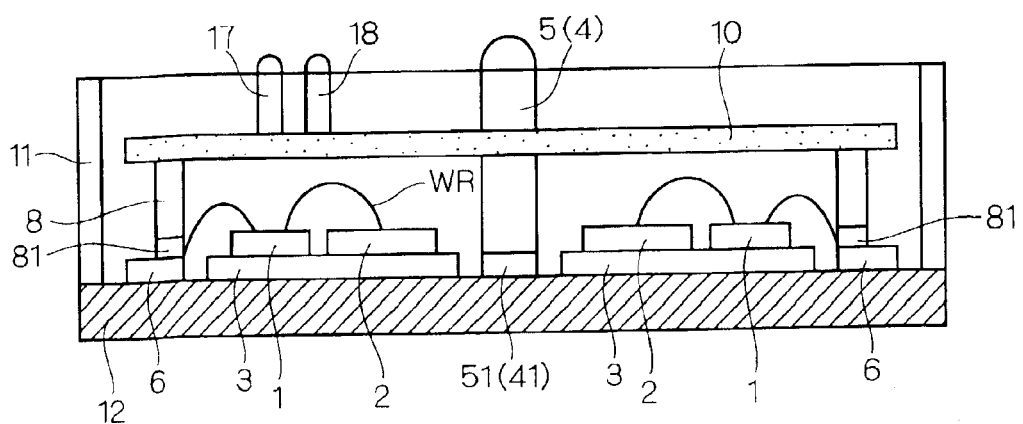
FIG. 2 is a cross-sectional view showing the structure of the power semiconductor device of the first preferred embodiment of the invention.

FIGS. 1 and 2 are a plan view and a cross-sectional view showing the structure of a power semiconductor device 100 as a first preferred embodiment of the power semiconductor device of the present invention. FIG. 2 is the cross section taken along the line A—A in FIG. 1

In FIGS. 1 and 2, a bottom substrate 12 has a rectangular shape in plan view and is made of a material having good thermal conductivity, e.g. metal, and two insulating substrates 3 are disposed in parallel at an interval on the bottom substrate 12. Three sets of devices, each including one IGBT device 1 and one diode device 2, are disposed on each insulating substrate 3. The six IGBT devices 1 are electrically connected in parallel to form one main circuit, with the diode devices 2 connected in parallel with them in a one-to-one manner in such a direction that the forward current flows back to the IGBT device 1.

Also on the bottom substrate 12, a main collector electrode terminal 4 and a main emitter electrode terminal 5, which vertically extend, are disposed in the region between the two insulating substrates 3.

The main collector electrode terminal 4 and the main emitter electrode terminal 5 are disposed on the bottom substrate 12 with a main collector substrate 41 and a main emitter substrate 51 interposed therebetween. The main collector electrode terminal 4 and the main emitter electrode terminal 5 are shown merely as quadrangular prisms for convenience, since their shape is not closely related to the invention; in practice, the main collector electrode terminal 4 and the main emitter electrode terminal 5 are formed in a shape having such a curvature as can reduce stress, or in such a shape as can reduce inductor.

At both ends of the bottom substrate 12 in the direction along the row of the insulating substrates 3, relay terminal plates 6 are disposed along the insulating substrates 3. On the bottom substrate 12, the IGBT devices 1 are disposed on the side closer to the relay terminal plate 6 and arranged in a row along the relay terminal plate 6.

The relay terminal plate 6 has electrically insulated control emitter pads 71 and gate pads 81 formed on a main surface of, e.g. an insulating substrate. The control emitter pads 71 are electrically connected to the control emitter electrodes (equivalent to the emitter electrodes) of the IGBT devices 1 through wire interconnections WR (aluminum wire) and the gate pads 81 are electrically connected to the gate electrodes of the IGBT devices 1 through wire interconnections WR.

The control emitter pads 71 and the gate pads 81 are provided in correspondence with the control emitter electrodes and the gate electrodes of the IGBT devices 1, and they are equally distant from the control emitter electrodes and the gate electrodes of the IGBT devices 1. Accordingly the control emitter pads 71 and the gate pads 81 are electrically connected through wire interconnections WR of equal length to the control emitter electrodes and the gate electrodes.

Vertically extending control emitter relay terminals 7 and gate relay terminals 8 are respectively connected to the control emitter pads 71 and the gate pads 81. The control emitter relay terminals 7 and the control emitter pads 71, and the gate relay terminals 8 and the gate pads 81, are connected together by soldering, for example.

Each IGBT device 1 has its emitter electrode electrically connected to the anode of the diode device 2 in the same set through a wire interconnection WR.

For convenience, FIGS. 1 and 2 do not show means electrically connecting the emitter electrodes of the IGBT devices 1 and the main emitter electrode terminal 5, and means electrically connecting the collector electrodes of the IGBT devices 1 and the main corrector electrode terminal 4, since they are not closely related to the invention.

A rectangular resin case 11 surrounds the bottom substrate 12 and a resin material is sealed in the space defined by the bottom substrate 12 and the resin case 11. The diagrams do not show the resin.

In FIGS. 1 and 2, an interconnection board 10 formed in the shape of a rectangular ring is disposed above the bottom substrate 12. The interconnection board 10 is disposed to cover the area above the peripheral portion of the bottom substrate 12 with an opening formed above the central area of the bottom substrate 12; the main collector electrode terminal 4 and the main emitter electrode terminal 5 pass through the opening to protrude from the opening of the resin case 11 so that they can be electrically connected to the outside. In FIG. 1, the interconnection board 10 is partially cut away for convenience.

The interconnection board 10 covers the area above the two relay terminal plates 6, and the control emitter relay terminals 7 and the gate relay terminals 8 extending from the control emitter pads 71 and the gate pads 81 are electrically connected to interconnection patterns formed in the interconnection board 10. A control emitter derive terminal 17 and a gate derive terminal 18 vertically extend from the upper main surface of the interconnection board 10 to protrude through the opening of the resin case 11 so that they can be electrically connected to the outside.

Figure 3:
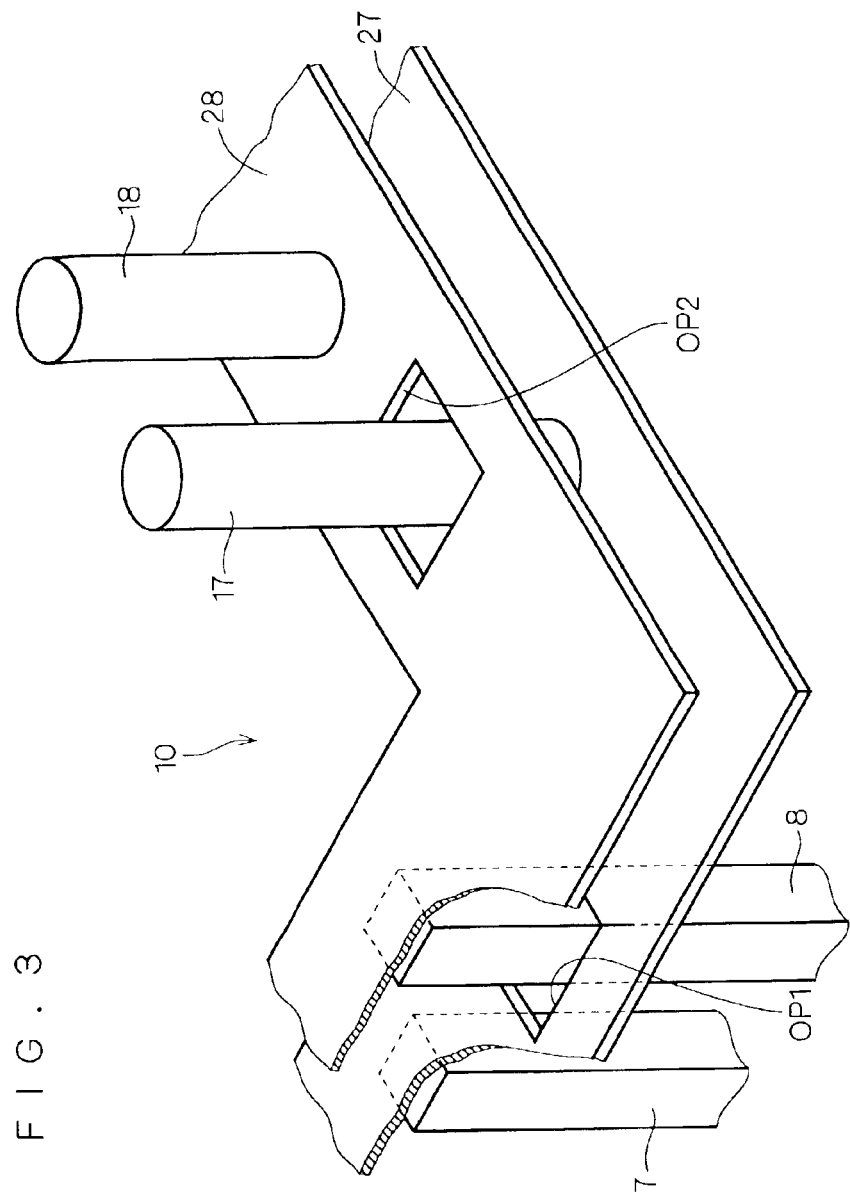
FIG. 3 is a partial perspective view showing the structure of an interconnection board of the power semiconductor device of the invention.

Now, referring to FIG. 3, an example of the structure of the interconnection board 10 is described. The interconnection board 10 shown in FIG. 3 is formed of a multi-layer substrate, where a control emitter interconnection pattern 27 is provided in the layer closest to the bottom substrate 12 and a gate interconnection pattern 28 is provided in the layer above it. Note that FIG. 3 only shows the interconnection patterns, without showing fundamental insulating layers etc.

In FIG. 3, the control emitter relay terminal 7 is connected to the control emitter interconnection pattern 27. The control emitter interconnection pattern 27 has an opening OP1, through which the gate relay terminal 8 is connected to the gate interconnection pattern 28.

The gate derive terminal 18, which extends in the direction opposite to the gate relay terminal 8, is connected to the gate interconnection pattern 28, and the control emitter derive terminal 17 extending in the direction opposite to the control emitter relay terminal 7 is connected to the control emitter interconnection pattern 27 through an opening OP2 formed in the gate interconnection pattern 28.

The control emitter interconnection pattern 27 and the control emitter relay terminal 7, the gate relay terminal 8 and the gate interconnection pattern 28, the control emitter interconnection pattern 27 and the control emitter derive terminal 17, and the gate interconnection pattern 28 and the gate derive terminal 18, may be connected together by soldering, for example.

Now, the control emitter interconnection pattern 27 and the gate interconnection pattern 28 have a small thickness but a large area, with a width equivalent to the width of the interconnection board 10, which structure is suited to reduce the impedance which decreases in inverse proportion to the conduction diameter.

The control emitter interconnection pattern 27 and the gate interconnection pattern 28 can be formed in the shape of a rectangular ring in correspondence with the plan-view shape of the interconnection board 10; however, when the control emitter interconnection pattern 27 and the gate interconnection pattern 28 are formed as ring-shaped interconnection patterns which surround the main collector electrode terminal 4 and the main emitter electrode terminal 5, then the main circuit current flowing through the main collector electrode terminal 4 and the main emitter electrode terminal 5 may exert influence to cause a circular flow of induced current and it may vary the gate characteristic, so that it is desirable to form them not in a ring-like shape but in a shape having a gap halfway.

In FIG. 3, the opening OP1 is formed in the control emitter interconnection pattern 27 so that the gate relay terminal 8 can pass through it and the opening OP2 is formed in the gate interconnection pattern 28 so that the control emitter derive terminal 17 can pass through it, but notch portions may be formed in place of the openings; also, the control emitter interconnection pattern 27 and the gate interconnection pattern 28 may be disposed in reverse order in the height direction. Further, the gate interconnection pattern 28 and the control emitter interconnection pattern 27 may be formed on the upper and lower main surfaces of a single substrate, in place of a multi-layered substrate, or the two interconnection patterns may be formed on the same plane.

A-2. Functions and Effects.

As described above, in the power semiconductor device 100, the rectangular-loop-shaped interconnection board 10, which has an opening for permitting the passage of the main collector electrode terminal 4 and the main emitter electrode terminal 5, is disposed above the bottom substrate 12, and the control emitter relay terminals 7 and the gate relay terminals 8 are electrically connected to the control emitter interconnection pattern 27 and the gate interconnection pattern 28 formed in the interconnection board 10. Then the control emitter electrodes and the gate electrodes of the IGBT devices 1 are connected to the control emitter pads 71 and the gate pads 81 through the wire interconnections WR of equal length, so that the differences in impedance, which would be caused by wire interconnections of different lengths, can be reduced, and the control emitter interconnection pattern 27 and the gate interconnection pattern 28 can be made to be equivalent in area to the interconnection board 10, thus providing a power semiconductor device with reduced interconnection impedance.

Furthermore, the rectangular-loop-shaped interconnection board 10 does not interfere the shortest paths of the main circuit terminals to the outside, so that the electric connections to the outside can be easily made through the shortest distance, thus preventing the problem that a long main circuit interconnection increases the inductance and affects the performance by, e.g. increasing the surge voltage.

Moreover, since the interconnection board 10 is disposed above the bottom substrate 12, the bottom substrate 12 can be effectively used for installation of the power, semiconductor elements, thus providing a power semiconductor device with lighter restrictions on the number and layout of the installed power semiconductor elements, and reducing gate voltage variations and oscillations caused by the current flowing in the main circuit.

A-3. First Variation.

Figure 4:
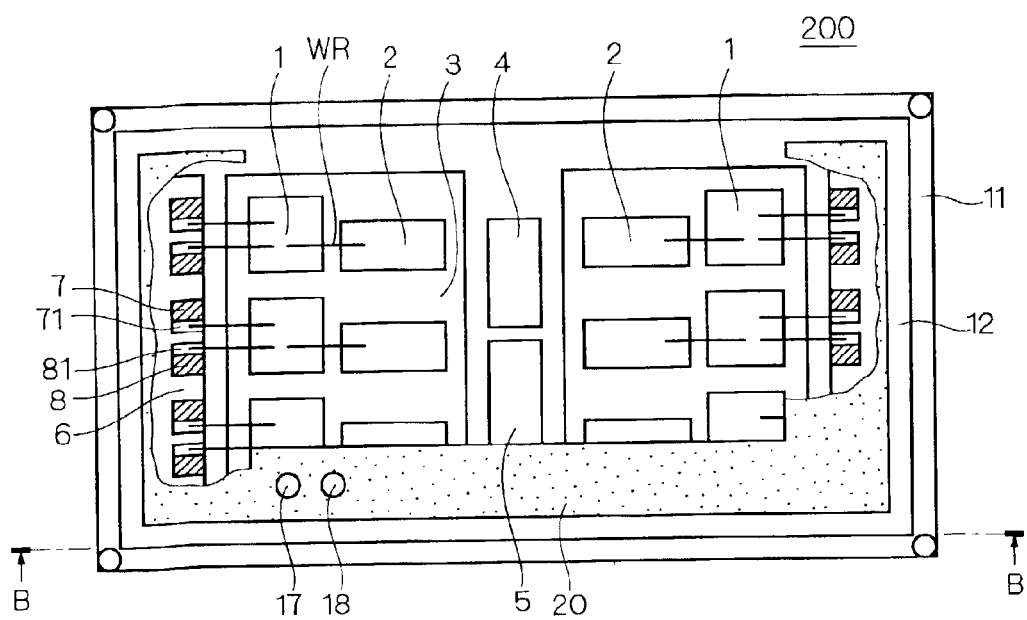
FIG. 4 is a plan view showing the structure of a variation of the power semiconductor device of the first preferred embodiment of the invention.
Figure 5:
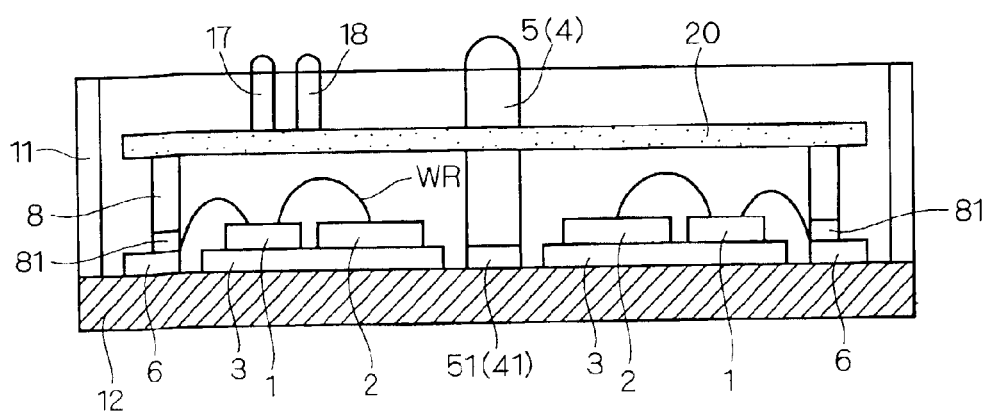
FIG. 5 is a cross-sectional view showing the structure of the variation of the power semiconductor device of the first preferred embodiment of the invention.

The power semiconductor device 100 described referring to FIGS. 1 and 2 uses the interconnection board 10 in the shape of a rectangular ring; however, as mentioned before, it can be formed as shown in the power semiconductor device 200 shown in FIGS. 4 and 5 in order to prevent a circular flow of induced current caused by the main circuit current.

FIGS. 4 and 5 are a plan view and a cross-sectional view showing the structure of the power semiconductor device 200. FIG. 5 is the cross section taken along the line B—B in FIG. 4.

As shown in FIG. 4, an interconnection board 20 shaped approximately like the letter "C" in plan view is disposed above the bottom substrate 12. The interconnection board 20 is disposed to cover the area above the two relay terminal plates 6 and one longer edge of the bottom substrate 12. It has an opening above the center area of the bottom substrate 12, and the main collector electrode terminal 4 and the main emitter electrode terminal 5 pass through this opening to protrude through the opening of the resin case 11 so that they can be electrically connected to the outside. In FIG. 4, the interconnection board 20 is partially cut away for convenience.

Other components that are the same as those of the power semiconductor device 100 of FIGS. 1 and 2 are shown with the same reference characters and not described again here.

As the interconnection board 20 is thus approximately C-shaped in plan view, the control emitter interconnection pattern 27 and the gate interconnection pattern 28 in the interconnection board 10 are not formed as ring-shaped interconnection patterns that surround the main collector electrode terminal 4 and the main emitter electrode terminal 5, so that a circular flow of induced current due to the main circuit current can be prevented to prevent variations in gate characteristic.

Also, the interconnection board 20 can be smaller in area than the rectangular-loop-shaped interconnection board 10 since it does not require the part covering the area above one longer edge of the bottom substrate 12, which allows the entire device to be reduced in size.

A-4. Second Variation.

Figure 6:
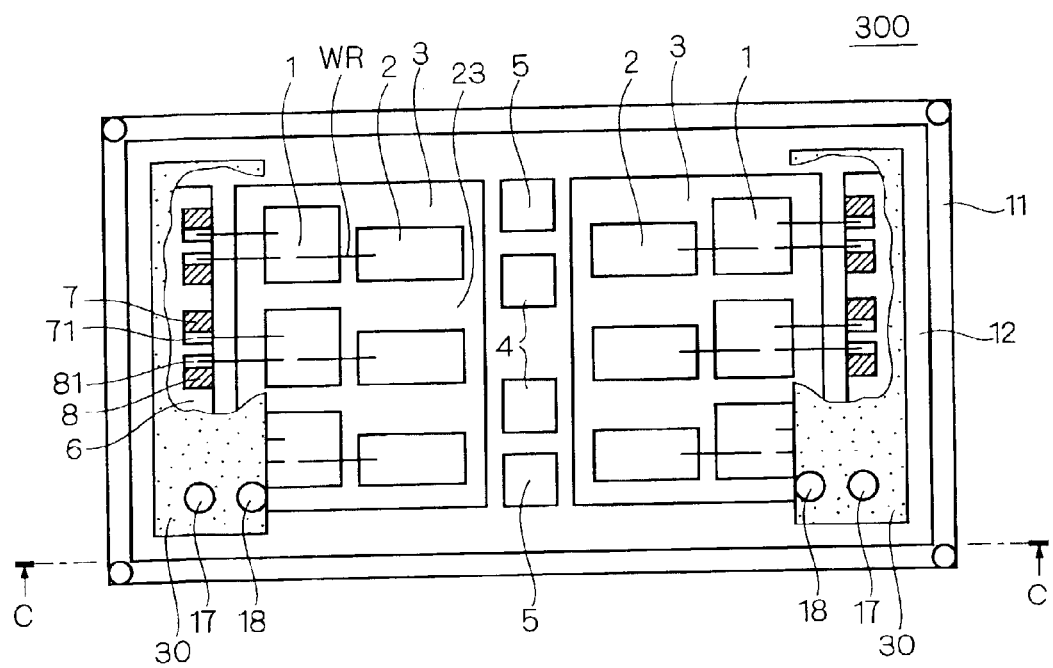
FIG. 6 is a plan view showing the structure of a variation of the power semiconductor device of the first preferred embodiment of the invention.
Figure 7:
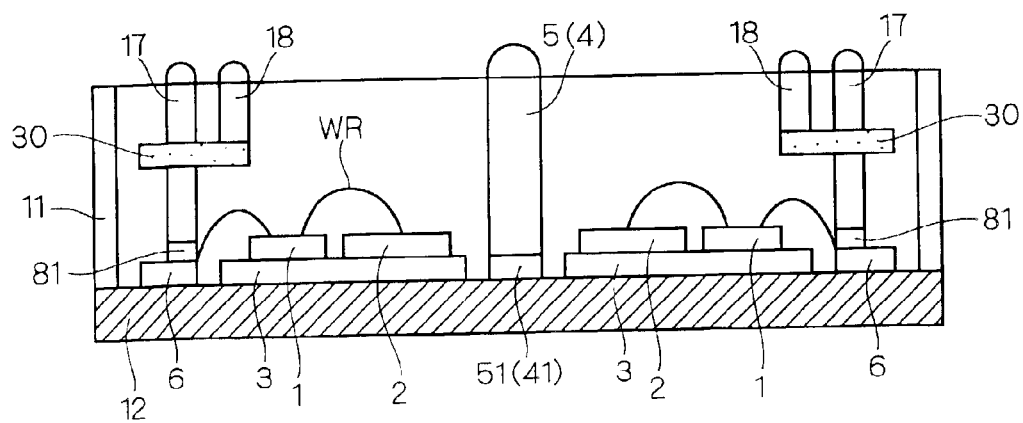
FIG. 7 is a cross-sectional view showing the structure of the variation of the power semiconductor device of the first preferred embodiment of the invention.

The power semiconductor device 100 described referring to FIGS. 1 and 2 has six IGBT devices 1 electrically connected in parallel to form one main circuit; however, needless to say, a plurality of main circuits can be disposed on the bottom substrate 12 as shown in the power semiconductor device 300 in FIGS. 6 and 7.

FIGS. 6 and 7 are a plan view and a cross-sectional view showing the structure of the power semiconductor device 300. FIG. 7 is the cross section taken along the line C—C in FIG. 6.

In FIG. 6, like those in the power semiconductor device 100, two insulating substrates 3 are disposed in parallel at an interval on the bottom substrate 12, and three sets of devices, each including one IGBT device 1 and one diode device 2, are disposed on each insulating substrate 3. However, the three IGBT devices 1 on the insulating substrate 3 on the left side in FIG. 7 and the three IGBT devices 1 on the right insulating substrate 3 are electrically independent of each other, and the three IGBT devices 1 in each group are electrically connected in parallel to form one main circuit. In FIG. 6, the interconnection board 30 is partially cut away for convenience.

Accordingly, two sets of vertically extending electrode terminals, each including one main collector electrode terminal 4 and a main emitter electrode terminal 5, are disposed in the region between the two insulating substrates 3, with one set electrically connected to the three IGBT devices 1 on the left insulating substrate 3 in FIG. 7 and the other electrically connected to the three IGBT devices 1 on the right insulating substrate 3 in FIG. 7.

Then, two interconnection boards 30 having a rectangular shape in plan view are disposed to respectively cover the areas above the two relay terminal plates 6. While the interconnection boards 30 are basically structured like the interconnection board 10 described referring to FIG. 3, they are sized to only cover the areas over the relay terminal plates 6 and their vicinities, and they each have a control emitter derive terminal 17 and a gate derive terminal 18 for the corresponding main circuit.

The control board can thus be divided to be adapted for a device having a plurality of main circuits.

Figure 8:
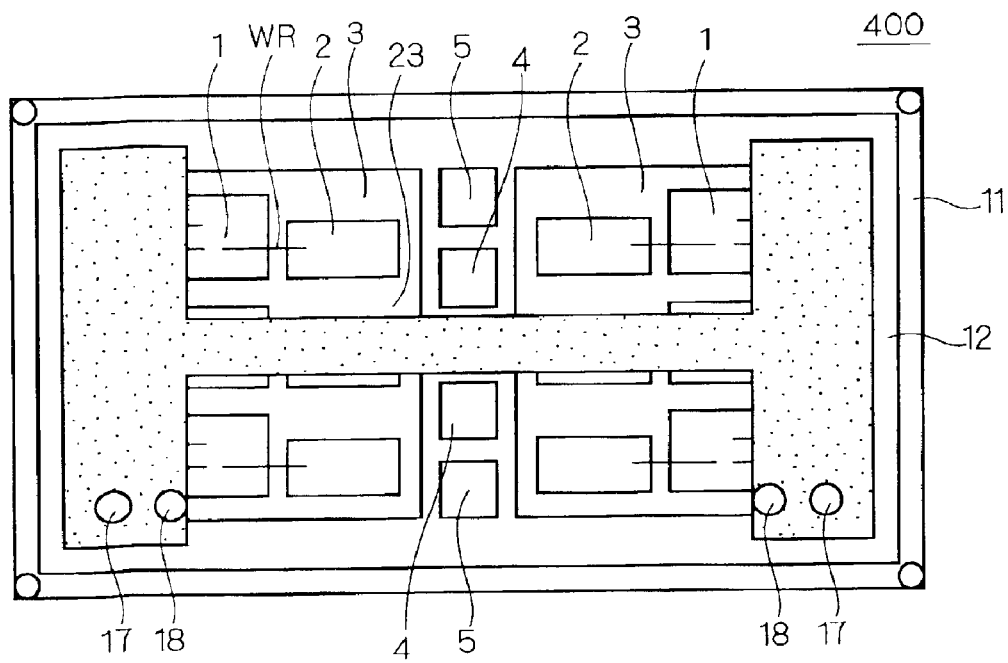
FIG. 8 is a plan view showing the structure of a variation of the power semiconductor device of the first preferred embodiment of the invention.

When the two main circuits in the power semiconductor device 300 are used as a single main circuit, the device can be constructed like the power semiconductor device 400 shown in FIG. 8.

That is to say, the power semiconductor device 400 of FIG. 8 has an interconnection board 40 in place of the interconnection board 30; in other respects its structure is the same as that of the power semiconductor device 300.

In the interconnection board 40, the two interconnection boards 30 of FIG. 6 are connected together through a part located at the middle of the longer sides, and it is thus approximately H-shaped in plan view. The control emitter interconnection pattern 27 and the gate interconnection pattern 28, too, are approximately H-shaped, and the control emitter electrodes and the gate electrodes of the total of six IGBT devices 1 are electrically connected in common respectively to the control emitter derive terminals 17 and the gate derive terminals 18.

While the two sets of main collector electrode terminals 4 and main emitter electrode terminals 5 are electrically independent of each other, the six IGBT devices 1 can be connected in parallel by connecting the main collector electrode terminals 4 together and connecting the main emitter electrode terminals 5 together on the outside.

In this way, a device having a plurality of main circuits can be easily modified into a device having a single main circuit by changing the control board.

While the power semiconductor device 400 of FIG. 8, like the power semiconductor device 100 of FIG. 1, has six IGBT devices 1 connected in parallel, the interconnection board 40 can be smaller in area than the rectangular-loop-shaped interconnection board 10 since it does not require the portions that cover the areas above the longer edges of the bottom substrate 12, which allows size reduction of the entire device.

A-5. Third Variation.

In the structure of the interconnection board 10 described referring to FIG. 3, the connection between the control emitter interconnection pattern 27 and the control emitter relay terminal 7, the connection between the gate relay terminal 8 and the gate interconnection pattern 28, the connection between the control emitter interconnection pattern 27 and the control emitter derive terminal 17, and the connection between the gate interconnection pattern 28 and the gate derive terminal 18, are made by soldering, but these connections can be made with screws.

Figure 9:
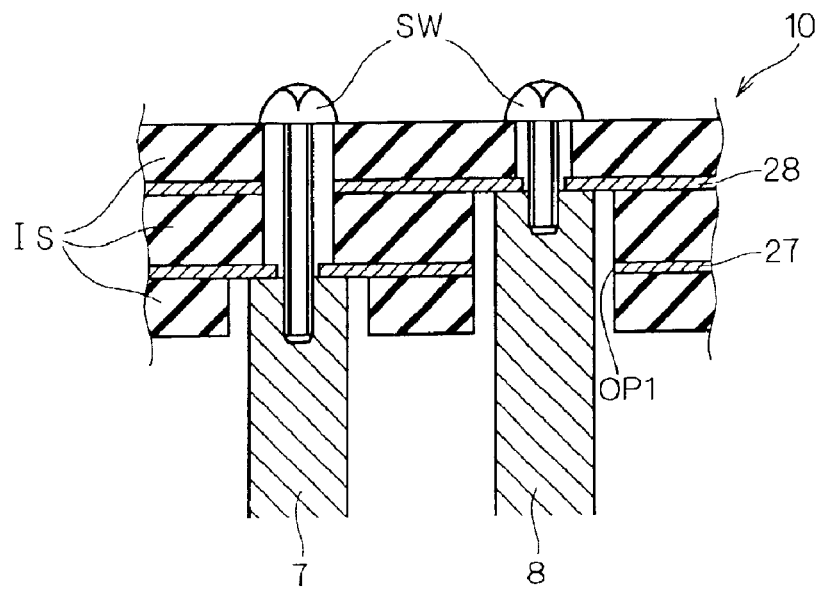
FIG. 9 is a partial cross-sectional view showing the structure of an interconnection board of the power semiconductor device of the invention.

In FIG. 9, the control emitter interconnection pattern 27 and the control emitter relay terminal 7, and the gate relay terminal 8 and the gate interconnection pattern 28, are connected with screws.

FIG. 9 is a cross-sectional view showing the connection between the interconnection board 10 and the control emitter relay terminal 7 and gate relay terminal 8. As shown in FIG. 9, the top end of the control emitter relay terminal 7 is in contact with the control emitter interconnection pattern 27 and a screw SW is inserted from the upper main surface side of the interconnection board 10 and engaged with that end of the control emitter relay terminal 7; the interconnection board 10 is thus sandwiched between the head of the screw SW and the end of the control emitter relay terminal 7 and the control emitter relay terminal 7 is fixed. The interconnection patterns are formed on insulating layers IS.

Also, the top end of the gate relay terminal 8 is in contact with the gate interconnection pattern 28 and a screw SW is inserted from the upper main surface side of the interconnection board 10 and engaged with that end of the gate relay terminal 8; the interconnection board 10 is thus sandwiched between the head of the screw SW and the end of the gate relay terminal 8 and the gate relay terminal 8 is fixed.

Needless to say, the joining with screws can be applied not only to the interconnection board 10 but also to the interconnection board 20 shown in FIG. 4, the interconnection board 30 shown in FIG. 6, and the interconnection board 40 shown in FIG. 8.

While the joining by soldering may suffer from inferior connection due to fatigue or deterioration at the soldered portion, such inferior connection can be prevented by using screws instead.

The use of screws also facilitates attachment and removal of the interconnection board 10.

Further, needless to say, the connection between the control emitter interconnection pattern 27 and the control emitter derive terminal 17, and the connection between the gate interconnection pattern 28 and the gate derive terminal 18, too, can be made with screws.

A-6. Fourth Variation.

While the interconnection boards 10 to 40 described in the first preferred embodiment and the first and second variations have the control emitter interconnection pattern 27 and the gate interconnection pattern 28, the interconnection boards 10 to 40 can be formed as control boards having control circuitry and elements for controlling operations of the IGBT devices 1 and the diode devices 2; providing control circuitry inside allows the power semiconductor devices 100 to 400 to work as IPMs (Intelligent Power Module).

Figure 10:
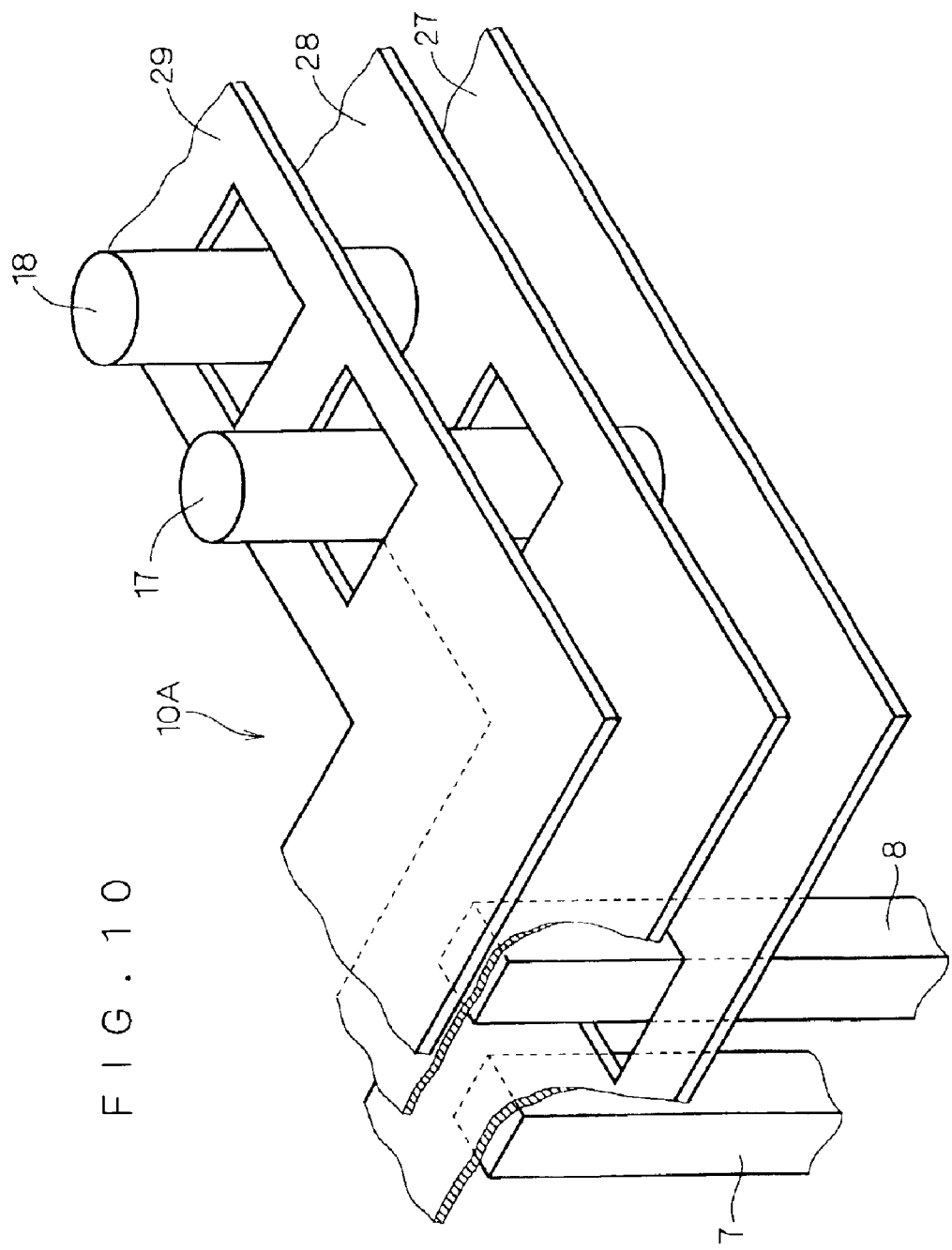
FIG. 10 is a partial perspective view showing the structure of an interconnection board of the power semiconductor device of the invention.

Referring to FIG. 10, the structure of a control board is now described in which such control circuitry can be installed. FIG. 10 is a partial perspective view showing the structure of a control board 10A in which the control circuitry can be provided; it is assumed that it is rectangular-loop-shaped like the interconnection board 10. In FIG. 10, the same components as those of the interconnection board 10 of FIG. 3 are shown at the same reference characters and not described again here.

As shown in FIG. 10, the control board 10A has a circuit board 29 as a layer above the gate interconnection pattern 28; control circuitry such as driving circuit and protection circuit can be provided in the circuit board 29. The circuit board 29 is formed of, e.g. a printed wiring board, which has an interconnection pattern in which the driving circuit and protection circuit are electrically connected to the control emitter derive terminal 17 and the gate derive terminal 18.

While FIG. 10 shows the control emitter derive terminal 17 and the gate derive terminal 18 passing through the circuit board 29, this diagram only shows the concept and the structure is not limited to this one, as long as it can electrically connect the driving circuit and protection circuit to the control emitter derive terminal 17 and the gate derive terminal 18.

The sense emitters of the IGBT devices 1, for example, may be electrically connected to the control board 10A; for this purpose, the control board 10A may be provided with a sense emitter interconnection pattern to which sense emitter relay terminals, like the control emitter relay terminals 7 and the gate relay terminals 8, are connected. The sense emitter is an electrode for detecting the emitter current of the IGBT device 1, which is connected to, e.g. an over current protection circuit, to contribute to the operation for protecting the IGBT device 1.

Thus, the power semiconductor device can be easily constructed as an IPM by using a control board in which control circuitry can be provided.

A-7. Fifth Variation.

In the power semiconductor devices 100 to 400 shown in the first preferred embodiment and the first and second variations, the control emitter electrodes and the gate electrodes of the IGBT devices 1 are connected through the wire interconnections WR to the control emitter pads 71 and the gate pads 81 provided on the relay terminal plates 6, but the control emitter electrodes and the gate electrodes may be electrically connected to separate relay substrates. Now such a structure is described referring to a power semiconductor device 500 shown in FIGS. 11 and 12.

Figure 11:
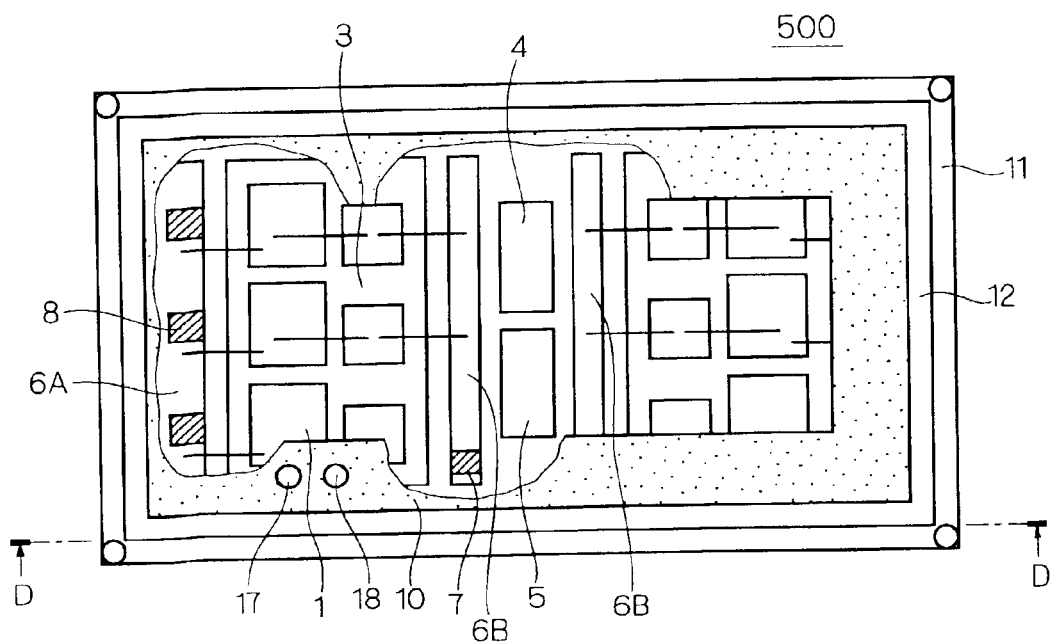
FIG. 11 is a plan view showing the structure of a variation of the power semiconductor device of the first preferred embodiment of the invention.
Figure 12:
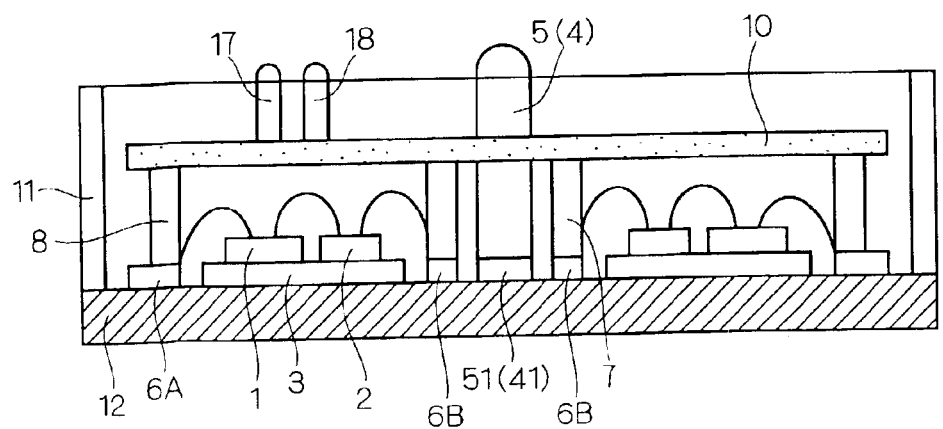
FIG. 12 is a partial cross-sectional view showing the structure of an interconnection board of the power semiconductor device of the invention.

FIGS. 11 and 12 are a plan view and a cross-sectional view showing the structure of the power semiconductor device 500. FIG. 12 is the cross-section taken along the line D—D in FIG. 11.

In FIG. 11, at both ends of the bottom substrate 12 in the direction along the row of the insulating substrates 3, gate relay terminal plates 6A are disposed along the insulating substrates 3. In the region between the two insulating substrates 3, emitter relay terminal plates 6B are disposed on both sides of the row of the main collector electrode terminal 4 and the main emitter electrode terminal 5.

The gate electrodes of the individual IGBT devices 1 are electrically connected to the nearby gate relay terminal plate 6A through wire interconnections WR and the anodes of the diode devices 2 are electrically connected to the nearby control emitter relay terminal plate 6B through wire interconnections WR. The gate electrodes of the individual IGBT devices 1 are equally distant from the gate relay terminal plate 6A. Thus the gate electrodes and the gate relay terminal plate 6A are electrically connected through wire interconnections WR having the same length.

The control emitter electrode of each IGBT device 1 is electrically connected to the anode of the diode device 2 in the same set through a wire interconnection WR, and as a result the control emitter electrodes are electrically connected to the control emitter relay terminal plate 6B.

A plurality of gate relay terminals 8 vertically extend from each of the two gate relay terminal plates 6A and are connected to the interconnection board 10 above, and control emitter relay terminals 7 vertically extend from the two control emitter relay terminal plates 6B and are connected to the interconnection board 10 above.

The same components as those of the power semiconductor device 100 of FIGS. 1 and 2 are shown by the same reference characters and are not described again.

As shown above, separately providing the gate relay terminal plates 6A and the emitter relay terminal plates 6B eliminates the need to provide the control emitter pads 71 and the gate pads 81 electrically insulated from the relay terminal plates 6, which simplifies the structure of the terminal plates.

A-8. Sixth Variation.

In the power semiconductor devices 100 to 400 shown in the first preferred embodiment and the first and second variations, six IGBT devices 1 are divided into two groups, each including three in series, and are disposed in two parallel rows, with the two relay terminal plates 6 disposed parallel respectively to the rows of IGBT devices 1; however, the layout of the IGBT devices 1 is not limited to this one but other layouts are possible as long as the IGBT devices 1 are arranged so that their gate electrodes and control emitter electrodes are spaced at the same distance from the relay terminal plates so that the wire interconnections can be equal in length. The number of IGBT devices 1 is not limited to six.

Figure 13:
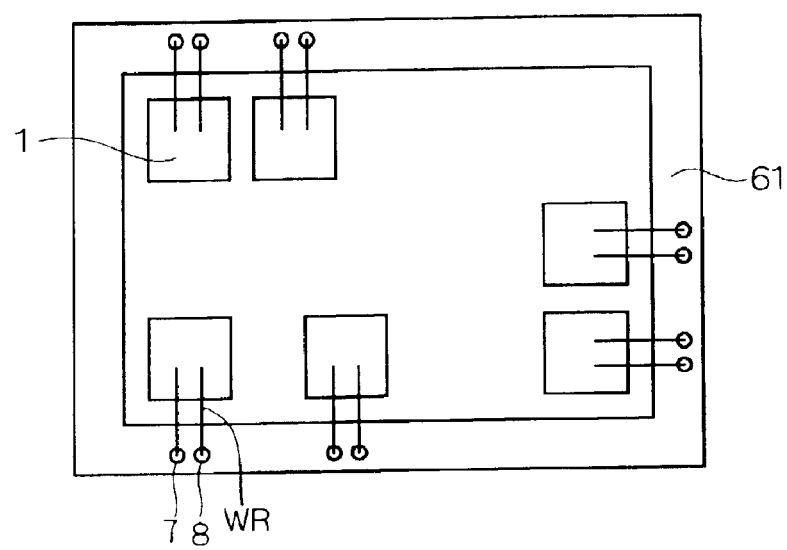
FIG. 13 is a plan view showing the structure of a variation of the power semiconductor device of the first preferred embodiment of the invention.

For example, in the structure shown in FIG. 13, sets of IGBT devices 1, each including two, are arranged in such a manner that sets of IGBT devices are positioned differently each other; however, when a rectangular-loop-shaped relay terminal plate 61 is used, the gate electrodes and the control emitter electrodes of the IGBT devices 1 can be connected through wire interconnections WR of equal length to the control emitter relay terminals 7 and the gate relay terminals 8.

Figure 14:
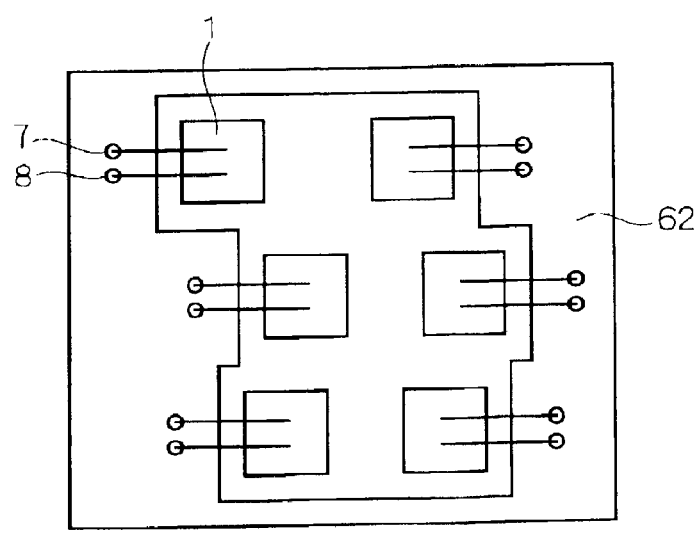
FIG. 14 is a plan view showing the structure of a variation of the power semiconductor device of the first preferred embodiment of the invention.

Also, in the structure shown in FIG. 14, while the IGBT devices 1 are irregularly arranged, a relay terminal plate 62 has an irregular contour which is adapted to the arrangement of the IGBT devices 1 so that the distances from the IGBT devices are equal, and thus the gate electrodes and control emitter electrodes of the IGBT devices 1 can be connected through wire interconnections WR of equal length to the control emitter relay terminals 7 and the gate relay terminal 8.

B. Second Preferred Embodiment

B-1. Device Structure.

Figure 15:
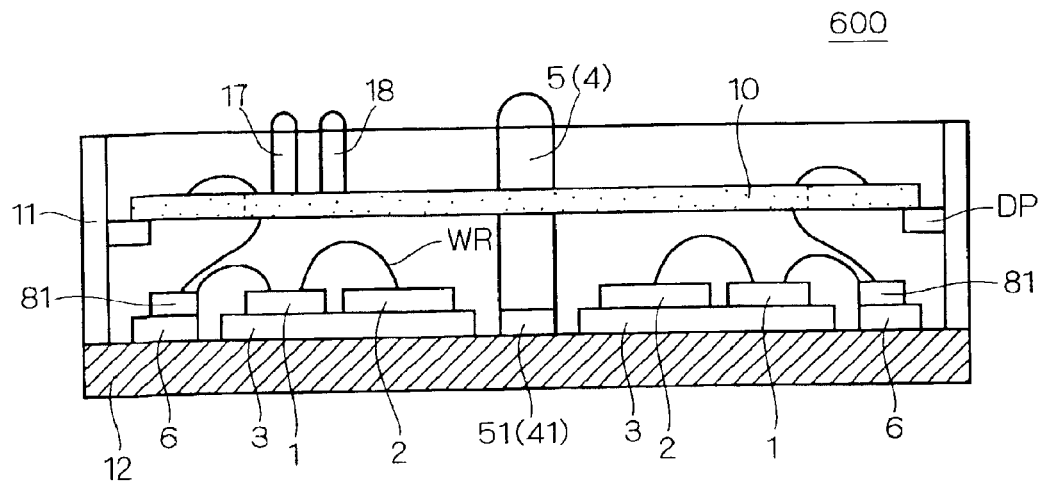
FIG. 15 is a cross-sectional view showing the structure of a power semiconductor device according to a second preferred embodiment of the invention.

FIG. 15 shows the cross-sectional structure of a power semiconductor device 600 as a second preferred embodiment of the power semiconductor device of the invention. In plan view, the power semiconductor device 600 has almost the same structure as the power semiconductor device 100 shown in FIG. 1.

In FIG. 15, the gate electrodes of the IGBT devices 1 are connected to the gate pads 81 on the relay terminal plates 6 through wire interconnections WR and the gate pads 81 are electrically connected to the upper main surface of the interconnection board 10 through wire interconnections WR. The control emitter electrodes of the IGBT devices 1 are connected in the same way, though not shown in the diagram, where the control emitter electrodes are connected to the control emitter pads 71 through wire interconnections WR and the control emitter pads 71 are electrically connected to the upper main surface of the interconnection board 10 through wire interconnections WR.

In order to connect the wire interconnections WR to the interconnection board 10, a gate interconnection pattern and a control emitter interconnection pattern are provided on the upper main surface of the interconnection board 10.

The same components as those of the power semiconductor device 100 of FIGS. 1 and 2 are shown with the same reference characters and not described again here.

B-2. Functions and Effects.

When the relay terminal plates 6 and the interconnection board 10 are electrically connected in this way through the wire interconnections WR by wire bonding, without using the control emitter relay terminals 7 and the gate relay terminals 8, fewer connections are made by soldering and the workability of assembly can be enhanced.

The interconnection board 10 may be fixed, e.g. with protrusions DP formed on the inner wall of the resin case 11, or with supports vertically extending from the bottom substrate 12.

B-3. Variation.

Figure 16:
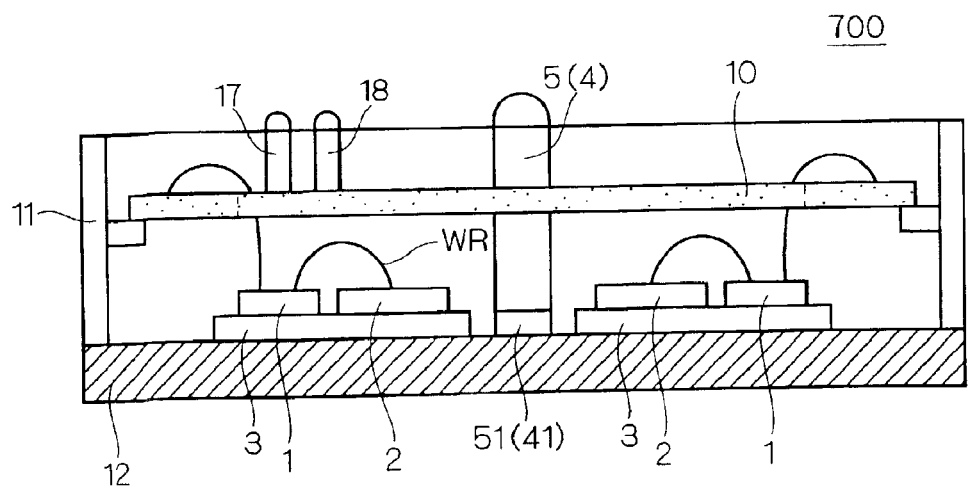
FIG. 16 is a cross-sectional view showing the structure of a variation of the power semiconductor device of the second preferred embodiment of the invention.
Figure 17:
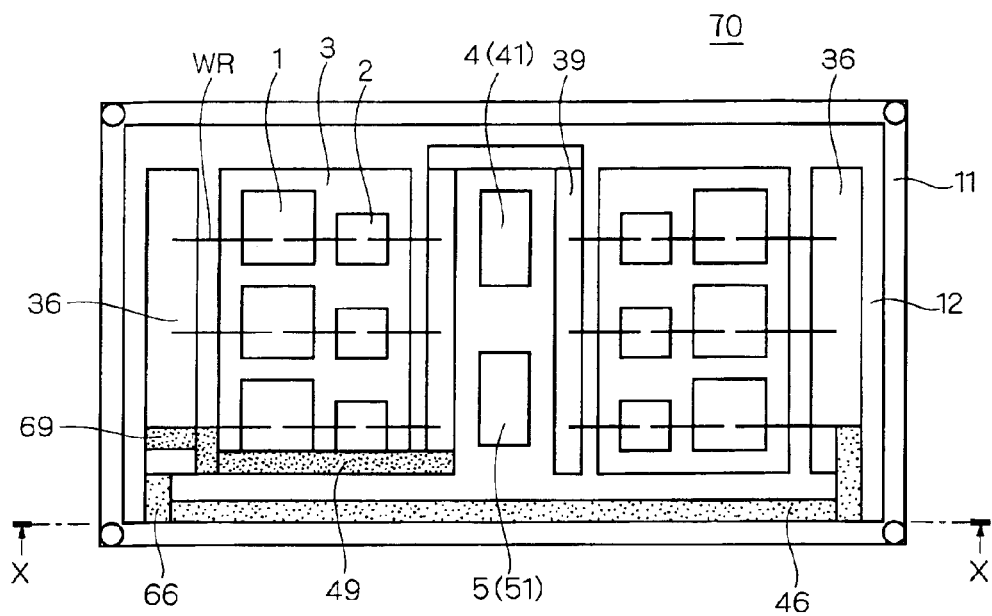
FIG. 17 is a plan view showing the structure of a conventional power semiconductor device.
Figure 18:
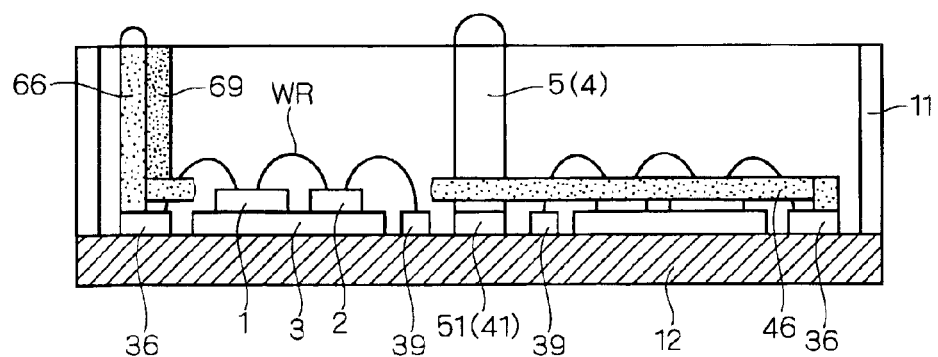
FIG. 18 is a cross-sectional view showing the structure of the conventional power semiconductor device.
Figure 19:
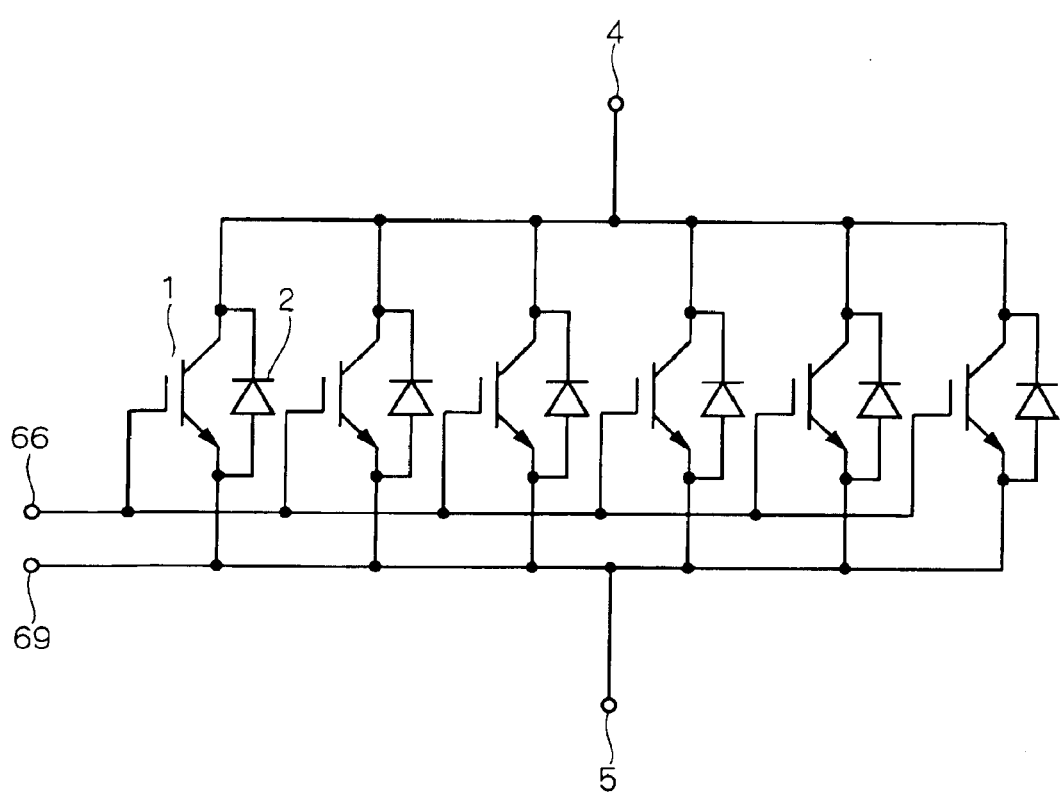
FIG. 19 is a diagram showing the connection of power semiconductor elements.
Figure 20:
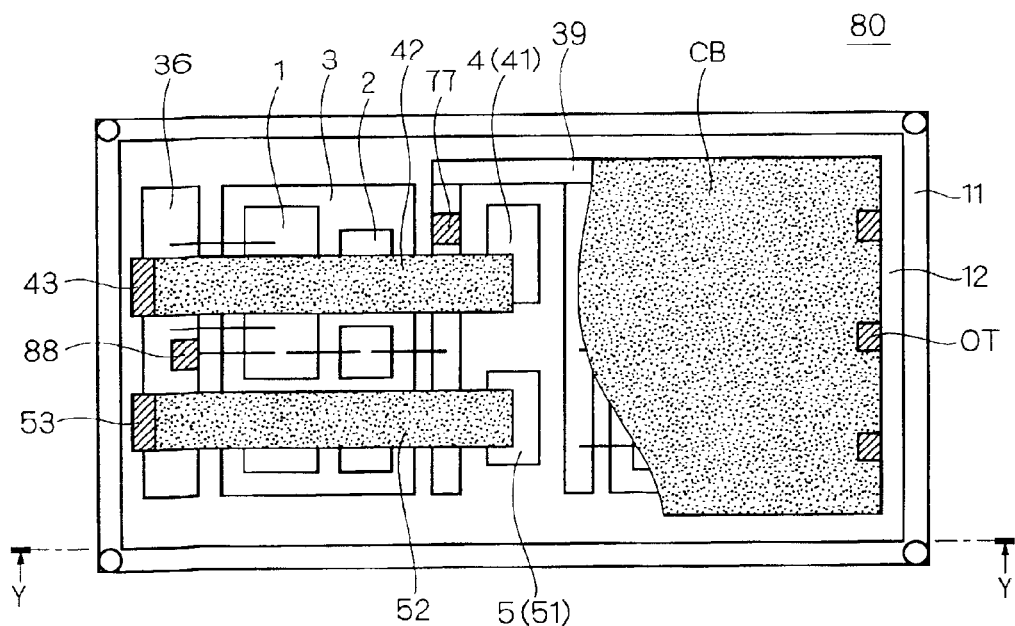
FIG. 20 is a plan view showing the structure of a conventional power semiconductor device.
Figure 21:
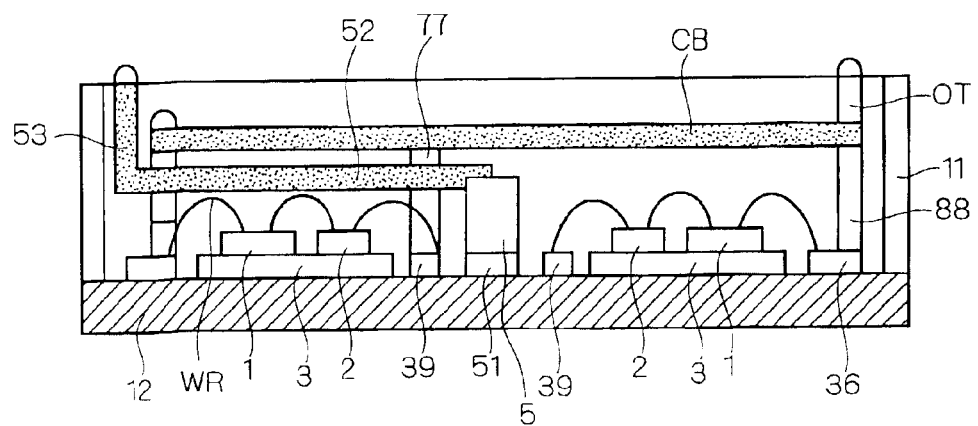
FIG. 21 is a cross-sectional view showing the structure of the conventional power semiconductor device.
Figure 22:
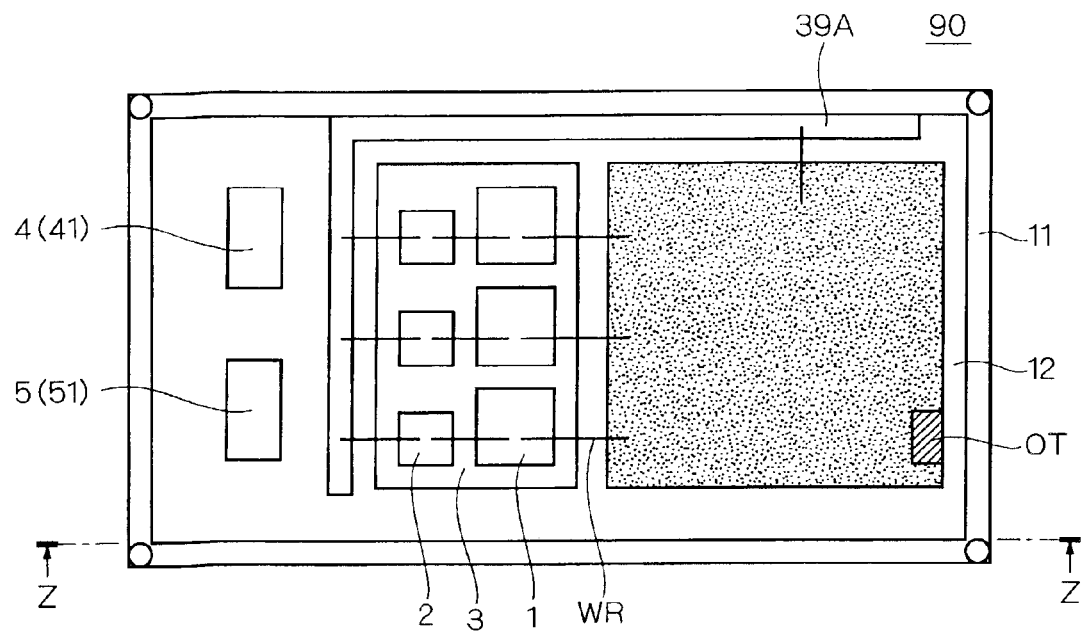
FIG. 22 is a plan view showing the structure of a conventional power semiconductor device.
Figure 23:
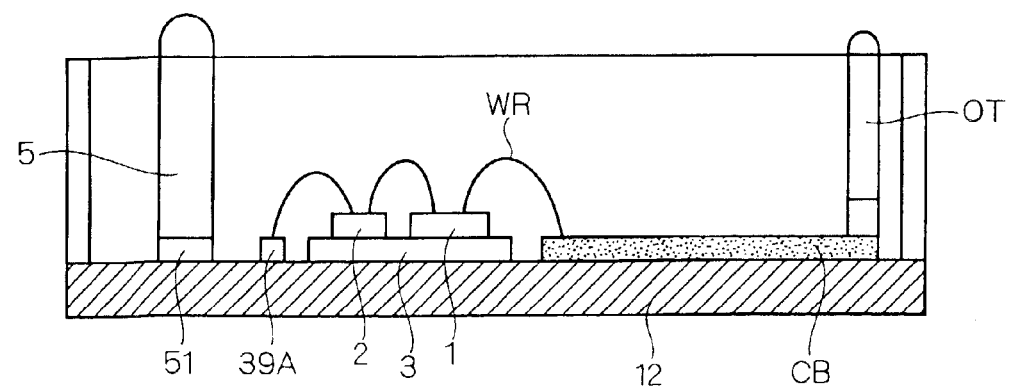
FIG. 23 is a cross-sectional view showing the structure of the conventional power semiconductor device.

In the power semiconductor device 600 shown above, the gate electrodes and the control emitter electrodes are electrically connected to the interconnection board 10 via the gate pads 81 and the control emitter pads 71; as shown in the power semiconductor device 700 of FIG. 16, however, the gate electrodes and the control emitter electrodes may be electrically connected directly to the interconnection board 10 through wire interconnections WR by wire bonding.

This structure eliminates the need for the relay terminal plates 6, thereby reducing the number of parts and reducing the manufacture cost.

While, in some cases, components such as resistors may be mounted on the relay terminal plates, they can be provided on the interconnection board 10 without any problem.

While the invention has been described in detail, the foregoing description is in all aspects illustrative and not restrictive. It is understood that numerous other modifications and variations can be devised without departing from the scope of the invention.

What is claimed is:

1. A power semiconductor device comprising:
   a bottom substrate;
   at least one insulating substrate having a given circuit pattern and provided on said bottom substrate;
   a plurality of power switching elements having gate electrodes and provided on said at least one insulating substrate;
   a board having at least a gate interconnection pattern; and
   a plurality of connecting elements electrically connecting in common each respective gate electrode of said plurality of power switching elements to said gate interconnection pattern such that each gate electrode in said power semiconductor device is connected in common,
   said board being disposed above a part of said bottom substrate, and
   said plurality of connecting elements each having a same electric connection length.

2. The power semiconductor device according to claim 1, further comprising:

a resin case disposed to surround said bottom substrate; and at least one pair of main electrode plates through which a main current of said plurality of power switching elements flows, wherein said connecting elements comprise, at least one relay substrate, provided on said bottom substrate and functioning as a relay point of an electric connection between said gate electrodes and said gate interconnection pattern, a gate relay element electrically connecting said gate interconnection pattern and said at least one relay substrate, and wire interconnections having equal lengths and connecting said at least one relay substrate and said gate electrodes of said plurality of power switching elements, wherein said board is disposed to cover an area above said at least one relay substrate without hindering said at least one pair of main electrode plates from extending out of said resin case through a shortest distance.

3. The power semiconductor device according to claim 2, wherein said board further comprises a control emitter interconnection pattern electrically connected in common to control emitter electrodes of said plurality of power switching elements, and said at least one relay substrate functions also as a relay point of an electric connection between said control emitter electrodes and said control emitter interconnection pattern, and wherein said connecting elements further comprise, a control emitter relay element electrically connecting said control emitter interconnection pattern and said at least one relay substrate, and wire interconnections having equal lengths and connecting said at least one relay substrate and said control emitter electrodes of said plurality of power switching elements.

4. The power semiconductor device according to claim 2, wherein said gate relay element includes pillar-like gate relay terminals disposed to vertically extend above said at least one relay substrate and directly connected to said gate interconnection pattern.

5. The power semiconductor device according to claim 2, wherein said gate relay element includes wire interconnections connecting said at least one relay substrate and said gate interconnection pattern.

6. The power semiconductor device according to claim 2, wherein said board is a control board in which a control circuit configured to drive and control said power switching elements is provided.

7. The power semiconductor device according to claim 1, further comprising at least one pair of main electrode plates through which a main current of said plurality of power switching elements flows, wherein said connecting elements comprise, two relay substrates provided on said bottom substrate and functioning as relay points of an electric connection between said gate electrodes and said gate interconnection pattern, a gate relay element electrically connecting said gate interconnection pattern and said two relay substrates, and wire interconnections having equal lengths and connecting said two relay substrates and said gate electrodes of said plurality of power switching elements, wherein said at least one insulating substrate includes two insulating substrates disposed on both sides of a region where said at least one pair of main electrode plates are disposed, said plurality of power switching elements are equally divided into two rows that are arranged respectively on said two insulating substrates, and said two relay substrates are located close to said two insulating substrates in a one-to-one correspondence and are disposed respectively along the rows of said power switching elements.

8. The power semiconductor device according to claim 7, wherein said gate relay element includes pillar-like gate relay terminals disposed to vertically extend respectively above said two relay substrates and directly connected to said gate interconnection pattern.

9. The power semiconductor device according to claim 8, wherein said board has a rectangular loop shape in plan view which has, in its opening, a path through which said at least one pair of main electrode plates extend outward.

10. The power semiconductor device according to claim 8, wherein said gate interconnection pattern has a non-looped, rectangular-loop-like shape in plan view which is formed by partially cutting off a rectangular loop similar to the shape of said board.

11. The power semiconductor device according to claim 8, wherein said board is approximately C-shaped in plan view and which has, in its opening, a path through which said at least one pair of main electrode plates extend outward.

* * * * *